United States Patent [19]

Kikuchi

[11] Patent Number: 4,602,172

[45] Date of Patent: Jul. 22, 1986

[54] HIGH INPUT IMPEDANCE CIRCUIT

[75] Inventor: Masafumi Kikuchi, Kanagawa, Japan

[73] Assignee: Sony Corporation, Tokyo, Japan

[21] Appl. No.: 493,152

[22] Filed: May 10, 1983

[30] Foreign Application Priority Data

May 18, 1982 [JP] Japan .................................. 57-82385

[51] Int. Cl.$^4$ ........................ H03K 5/22; H03L 5/00; H03G 3/18
[52] U.S. Cl. .................................. 307/494; 307/264; 307/555; 330/282; 330/257
[58] Field of Search ............... 307/475, 493, 494, 490, 307/350, 530, 354, 362, 540, 555, 264, 557, 297, 296 R; 330/252, 255, 257, 261, 262, 278, 282

[56] References Cited

U.S. PATENT DOCUMENTS

| 3,432,650 | 3/1969 | Thompson | 307/494 |
| 3,739,195 | 6/1973 | Fidi et al. | 307/494 |
| 3,745,477 | 7/1973 | Freeborn | 330/255 |
| 3,944,944 | 3/1976 | Ellenbecker | 330/255 |
| 4,152,667 | 5/1979 | Visser | 330/278 |

FOREIGN PATENT DOCUMENTS

| 2614454 | 10/1977 | Fed. Rep. of Germany | 330/255 |
| 58-85607 | 5/1983 | Japan | 307/540 |
| 0611288 | 6/1978 | U.S.S.R. | 330/255 |

Primary Examiner—Stanley D. Miller
Assistant Examiner—Timothy P. Callahan
Attorney, Agent, or Firm—Lewis H. Eslinger; Alvin Sinderbrand

[57] ABSTRACT

A high input impedance circuit having a first differential circuit consisting of a pair of NPN transistors and a second differential circuit consisting of a pair of PNP transistors, is disclosed. One input terminal of the first differential circuit is connected to one input terminal of the second differential circuit. The other input terminal of the first differential circuit is connected to the other input terminal of the second differential circuit. A signal is supplied through a capacitor to one input terminal for eliminating a DC component of the signal. A DC biasing circuit for biasing the first and second differential circuits is connected to the other input terminal. First and second current source circuits are connected to the first and second differential circuits respectively.

5 Claims, 7 Drawing Figures

HIGH INPUT IMPEDANCE CIRCUIT

BACKGROUND OF THE INVENTION

1. Field of the Invention

This invention relates to a buffer circuit and, more particularly, to a high impedance circuit for a signal processing circuit.

2. Description of the Prior Art

As well-known buffer circuits of the type noted above, there are an emitter follower circuit as shown in FIG. 1, consisting of NPN transistors 1 and 2, and a source follower circuit as shown in FIG. 2, consisting of a field-effect transistor 3 and resistors R1 and R2. In these prior art buffer circuits, however, part of the input signal principally flows as base current or to a bias resistor. Therefore, the circuit's input impedance cannot be freely increased. Where the buffer circuit is used in a clamp circuit, a sample/hold circuit or a drive circuit for driving a capacitive load, therefore, waveform distortions are liable to result due to the fact that the input impedance cannot be freely increased. FIG. 3 shows a circuit which is disclosed in "IEEE Journal of Solid-State Circuit", Vol. SC-16, No. 6, December 1981, pp. 748-749. This circuit uses transistors 11 to 14 respectively having high current amplification factors $h_{fe1}$, $h_{fe2}$, $h_{fe3}$ and $f_{fe4}$. When $h_{fe1} \cong h_{fe2} \cong h_{fe3} \cong h_{fe4}$ the base currents $i_{B1} \cong i_{B2}$ in the respective transistors 11 and 12 are $i_{B1} \cong i_{B2}$. This means that the base currents for driving the transistors 11 and 12 need not be supplied from a signal source. To be more specific, in the circuit of FIG. 3 an input signal $V_{IN}$ from an input signal terminal 10 is applied to the common base of first PNP and NPN transistors 11 and 12. The first PNP transistor 11 has its collector grounded and its emitter connected to the collector of a second PNP transistor 14. The NPN transistor 12 has the emitter connected to a signal output terminal 18 and also connected to a constant current source 15 and the collector connected to the emitter of a second NPN transistor 13. The second PNP and NPN transistors 14 and 13 have a common base. The emitter of the second PNP transistor 14 and the collector of the second NPN transistor 13 are commonly connected to a power supply terminal 17.

In the above circuit, the collector currents $I_1$ to $I_4$ through the respective transistors 11 to 14 are given as $$I_1 = h_{fe1} \cdot i_{B1},$$

$$I_2 = h_{fe2} \cdot i_{B2},$$

$$I_3 = h_{fe3} \cdot i_{B3},$$

and $$I_4 = h_{fe4} \cdot i_{B4}$$

where $i_{B1}$, $i_{B2}$, $i_{B3}$ and $i_{B4}$ are respectively the base currents through the transistors 11 to 14 and $h_{fe1}$, $h_{fe2}$, $h_{fe3}$ and $h_{fe4}$ are respectively the current amplification factors of the transistors 11 to 14. The case current $i_{B2}$ in the first NPN transistor 12, which has its emitter connected to the constant current source 15, is given as $$i_{B2} = \frac{I}{1 + h_{fe2}}$$

I is the current in the constant current source 15.

The base current $i_{B3}$ in the second NPN transistor 13, which has its emitter connected to the collector of the first NPN transistor 12, is given as $$i_{B3} = \frac{I_2}{1 + h_{fe3}}$$

$$= \frac{h_{fe2} \cdot i_{B2}}{1 + h_{fe3}}$$

This means that the base current $i_{B4}$ flowing in the second PNP transistor 14, which has its base common to the base of the second NPN transistor 13, is given as $$i_{B4} = i_{B3}$$

$$= \frac{h_{fe2} \cdot i_{B2}}{1 + h_{fe3}}$$

The collector current $I_4$ in the transistor 14 is thus $$I_4 = i_{B4} \cdot h_{fe4}$$
$$= i_{B3} \cdot h_{fe4}$$
$$= \frac{h_{fe2} \cdot i_{B2}}{1 + h_{fe2}} \cdot h_{fe4}$$

Thus, the base current $i_{B1}$ in the first PNP transistor 11, which has the emitter connected to the collector of the second PNP transistor 14, is $$i_{B1} = \frac{I_4}{1 + h_{fe1}}$$

$$= \frac{h_{fe2} \cdot h_{fe4} \cdot i_{B2}}{(1 + h_{fe1}) \cdot (1 + h_{fe3})}$$

The transistors 11 to 14 may be integrated on the same substrate so that they have the same operating characteristics and an equal current amplification factor $h_{fe}(h_{fe} > 1)$. In this case, the base current $i_{B1}$ in the first PNP transistor 11 is $$i_{B1} = \frac{h_{fe}^2}{(1 + h_{fe})^2} \cdot i_{B2}$$

$$\approx i_{B2}$$

that is, it is substantially equal to the base current $i_{B2}$ through the first NPN transistor 12. Theoretically, this means that the input impedance $Z_{in}$ of the circuit of FIG. 3 is infinite. That is, the circuit of FIG. 3 is a high input impedance circuit. However, this circuit requires a bias circuit for providing a bias to the transistors 11 and 12. The bias circuit usually consists of the resistors R1 and R2 as shown in FIG. 3, so that it reduces the input impedance.

SUMMARY OF THE INVENTION

An object of the invention is to provide an improved buffer circuit.

Another object of the invention is to provide a high input impedance circuit.

A further object of the invention is to provide a high input impedance circuit, the input impedance of which is not reduced by adding a bias circuit.

Principally, the invention seeks to provide a novel high input impedance circuit by making use of the principles of the circuit shown in FIG. 3.

DESCRIPTION OF THE PREFERRED EMBODIMENTS

Figure 4:
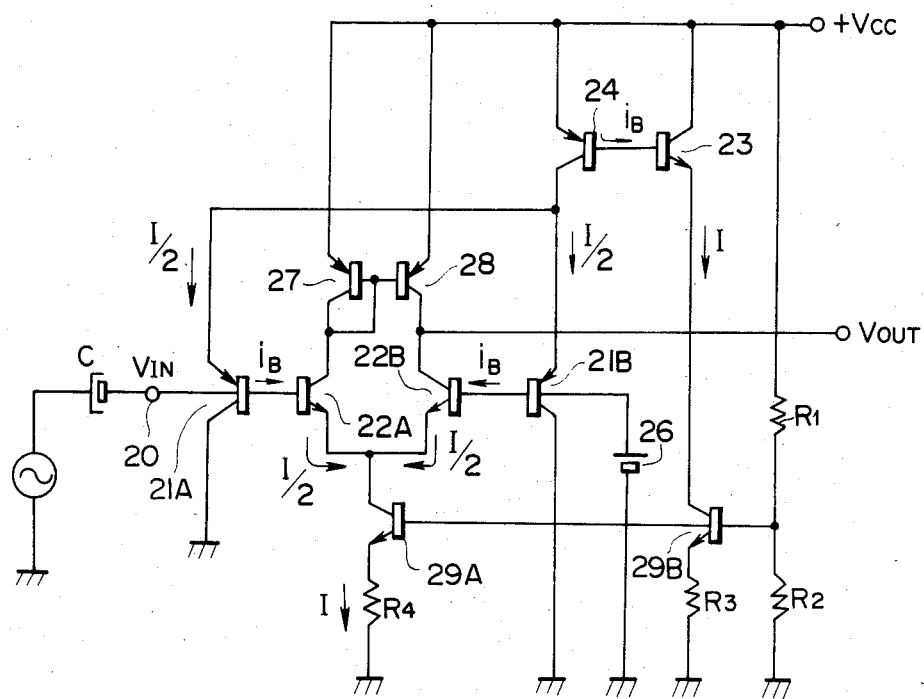

FIG. 4 shows an embodiment of the invention. In this circuit, an input signal $V_{in}$ from a signal input terminal 20 is applied to the common base of first PNP and NPN transistors 21A and 22A. Second PNP and NPN transistors 21B and 22B have a common base, which is connected to a bias source 26. The first and second PNP transistors 21A and 21B have their collectors grounded and their emitters commonly connected to the collector of a third PNP transistor 24. This transistor 24 has the emitter connected to a power supply terminal at $+V_{cc}$ and the base connected to the base of a third NPN transistor 23. The third NPN transistor has its collector connected to the $+V_{cc}$ power supply terminal and the emitter connected to the collector of a fourth NPN transistor 29B. The fourth NPN transistor 29B has a common base to a fifth NPN transistor 29A. This common base is connected to the connection point between resistors R1 and R2. The other terminal of the resistor R1 is connected to the $+V_{cc}$ power supply terminal, and the other terminal of the resistor R2 is grounded. The fourth and fifth NPN transistors have their emitters grounded through respective resistors R3 and R4. The first and second NPN transistors 22A and 22B have their emitters commonly connected to the collector of the fifth NPN transistors 29A. The fourth PNP transistor 27 has its base connected to its collector so that it acts as a diode. The connection point between its base and collector is connected to the collector of the first NPN transistors 22A and the base of the fifth PNP transistor 28. The transistor 28 has its emitter connected to the $+V_{cc}$ power supply terminal and the collector connected to the collector of the second NPN transistor 22B and also to an output terminal $V_{OUT}$.

The resistors R1 to R4 and transistors 29A and 29B constitute a current mirror circuit. That is, denoting the current in the collector of the transistor 29B by I, the same current I flows in the collector of the transistor 29A. The collector current I through the transistor 29A drives a differential amplifier circuit which is constituted by the transistors 22A and 22B.

The operation of the circuit of FIG. 4 having the above construction will now be described. When current I flows through the transistor 29B, this current I also flows through the transistor 23. This further causes current I to flow through the transistor 24. Further, since the transistor 21B is supplied with a bias from the bias source 26, the transistor 21B is "on" and is carrying a collector current supplied from the transistor 24. The base bias to the transistor 21A, which is differentially connected to the transistor 21B, is not fixed. The transistor 21A is therefore carrying no current, that is, it is "off". In other words, for the differential pair of the transistors 21A and 21B, their base voltages $V_{B(21A)}$ and $V_{B(21B)}$ are related as $$V_{B(21A)} \geqq V_{B(21B)} \quad (1)$$

Meanwhile, in the other differential pair of the transistors 22A and 22B the transistor 22B is biased from the bias source. The transistor 22B is thus "on", with its emitter current being withdrawn into the current source for the transistor 29A. Since the transistor 22A is "off", the base voltages $V_{B(22A)}$ and $V_{B(22B)}$ on these transistors 22A and 22B are related as $$V_{B(22A)} \leqq V_{B(22B)} \quad (2)$$

Since $V_{B(21A)} = V_{B(22A)}$ and $V_{B(21B)} = V_{B(22B)}$, the base voltage on the transistors 21A and 22A must be made equal to the base voltages on the transistors 21B and 22B in order that the equations (1) and (2) be satisfied. Consequently, the input terminal 20 is biased to the same potential as the voltage of the bias source 26. The transistor 21A is thus turned on, so that the same collector current I/2 as in the transistor 21B is carried by it. Further, the same collector current I/2 is carried by the transistor 22A.

Since the base current in the transistor 22A is the base current in the transistor 21A, the base current supplied, as viewed from the input terminal 20, is approximated to zero, that is, a high input impedance circuit can be realized.

It is to be appreciated that a high input impedance circuit which does not need any bias resistor can be realized.

Figure 5:
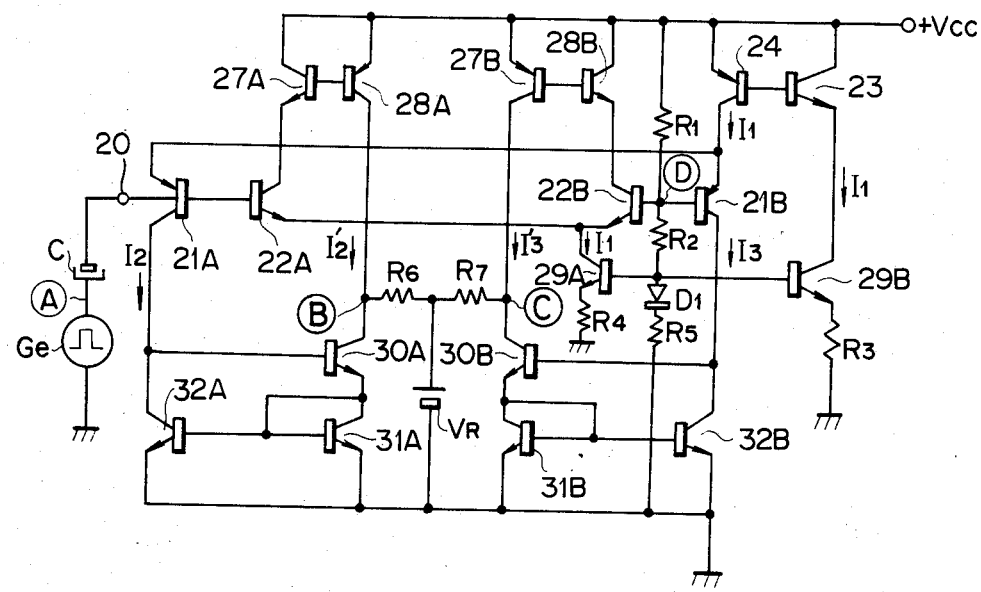

FIG. 5 shows an amplification of the high input impedance circuit according to the invention applied to a pulse detection circuit. In the Figure, like parts as those in FIG. 4 are designated by like reference numerals and symbols.

Figure 6:
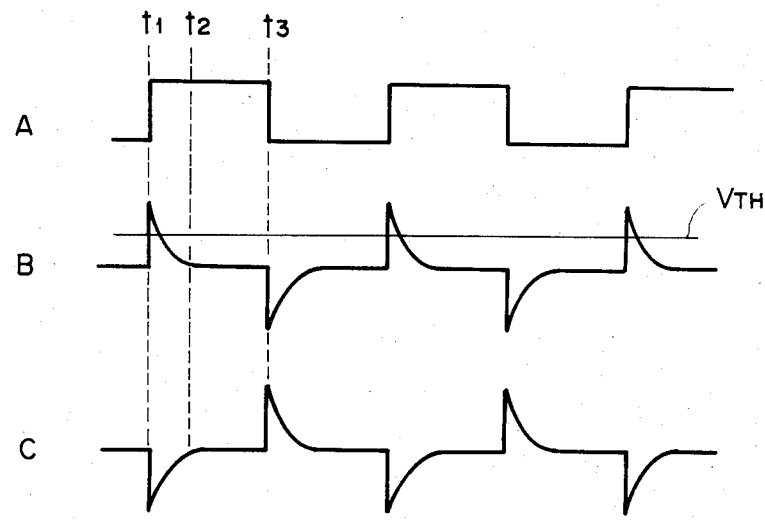

In this circuit, a bias voltage is applied to the base of transistors 22B and 21B from a connection point D in a series circuit consisting of resistors R1, R2 and R5 and a diode D1. This bias voltage is also given to the base of transistors 21A and 22A in the manner as as described before in connection with FIG. 4. Further, the base of the transistors 29A and 29B is connected to the anode of the diode D1 to form a current source. Transistors 30A, 31A and 32A constitute a current source, and transistors 30B, 31B and 32B constitute another current source. It is now assumed that there is no signal supplied to the input terminal 20. When collector current $I_1$ flows through the transistor 29B, the same current $I_1$ flows through the collector of the transistor 24. This current $I_1$ also flows through collector currents $I_2$ and $I_3$ ($I_2 = I_3$) in the transistors 21A and 21B. The collector current $I_2$ in the transistor 21A drives the current source constituted by the transistors 30A, 31A and 32A. To be more specific, current $I_2$ flows through the transistor 30A, while current $I_2'$ flows through the transistors 31A and 32A. The current $I_2$ flowing through the transistor 30A drives the transistor 27A and 28A. Likewise, current $I_3$ flows through the transistor 30B while current $I_3'$ flows through the transistors 31B and 32B. Resistors R6 and R7 are connected in series between the collectors of the transistors 30A and 30B. A bias source $V_R$ is connected to the connection point between the series resistors R6 and R7. Since $I_2 \approx I_2'$ and $I_3 \approx I_3'$, no current flows through the resistors R6 and R7. Thus the output terminal of this circuit, i.e., the collector (point B) of the transistor 30B and the collector (point C) of the transistor 30B are biased from the bias source $V_R$ and held at the same potential. Now, the operation of the circuit when a pulse signal as shown in FIG. 6A is supplied from a generator Ge through a capacitor C to the input terminal 20 will be described. The voltage variation of the input pulse signal is transmitted through the capacitor C to the base of the transistors 21A and 22A. As a result, the voltages at the points D and E get out of balance, so that the transistors 21A and 22B are both turned off. When the transistor 21A is turned off, the collector current I₂ therein is cut off. Thus, the current source consisting of the transistors 30A, 31A and 32A is turned off. At this time, the transistor 21B is "on", and hence the current source constituting of the transistors 30B, 31B and 32B is "on". Meanwhile, since the transistor 22A is "on", the transistors 27A and 28B are "on", and collector current $I_2'$ is carried by the transistor 28A. Further, the transistors 27B and 28B are "off" since the transistor 22B is "off". The collector current $I_2'$ in the transistor 28A flows through the resistors R6 and R7 into the transistor 30B and 31B. With the current paths as described above, the potential at the point B is increased at an instant $t_1$ to $I_2R6+V_R$, as shown in B in FIG. 6. On the other hand, the potential at the point C falls to $V_R-I_2R_7$ at this instant, as shown in C in FIG. 6. Since the transistor 21A is "off" while the transistor 22A is "on", the input impedance at this time as looked from the input terminal 20 is low compared to that in case when both the transistors 21A and 22A are "on". This is because the base current in the transistor 22A which is "on" is not entirely supplied to the input terminal 20. The source of this base current is the charge stored in the capacitor C. Therefore, when the base current has been supplied for a fixed period of time, the potential on the input terminal 20 becomes equal to the potential on the point D. This state is identical with the state without input signal mentioned before. The base current is supplied from the capacitor C to the transistor 22A for a period from the instant $t_1$ to an instant $t_2$ in FIG. 6. As the potential on the input terminal 20 approaches the potential on the point D, the collector current in the transistor 21A increases, and eventually the transistors 30A and 31A turn on to carry current to reduce the current through the resistors R6 and R7. The potentials on the points B and C thus approach, respectively downwardly and upwardly, to the voltage $V_R$. This situation is shown from the instant $t_1$ to the instant $t_2$ in B and C in FIG. 6. From the instant $t_2$ to an instant $t_3$ the same state as the initial state persists. At the instant $t_3$, the voltage on the input terminal 20 falls to turn off the transistors 22A and 21B, and then to turn off the terminal 28A. Since the transistor 21A is "on" at this time, the current source consisting of the transistors 30A, 31A and 32A is rendered operative, while the current source consisting of the transistors 30B, 31B and 32B is rendered inoperative. With these actions, the collector current $I_3$ in the transistors 27B flows through the resistors R7 and R8 into the transistors 30A and 31A. The potentials on the points B and C at this time, i.e., at the instant $t_3$, are respectively $V_4-I_3R6$ and $V_R+I_3R7$ as shown in B and C in FIG. 6.

With the above circuit, a signal synchronized to the waveform shown in A in FIG. 6 can be obtained by comparing the voltage at the point B in a suitable comparator. The circuit thus can be used as a pulse detection circuit.

Figure 7:
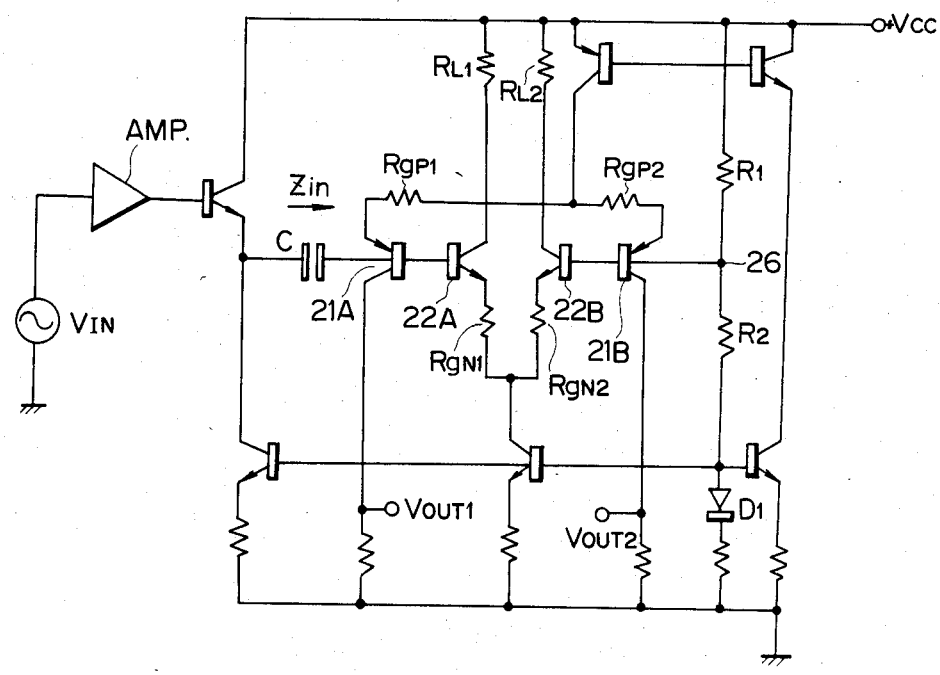

FIG. 7 shows a further application of the circuit according to the invention. In this circuit, a resistor $R_{L1}$ is used in lieu of the transistor 27 in FIG. 4 and a resistor $R_{L2}$ is used in lieu of the transistor 28. The input impedance of this circuit looked from the terminal of capacitor C, is that of the parallel combination of an emitter follower circuit consisting of a transistor 22A and resistors $R_{gN1}$ and $R_{gN2}$ in series therewith and an emitter follower circuit consisting of a transistor 21A and resistors $R_{gP1}$ and $R_{gP2}$ in series therewith. Denoting the input impedance noted above by $Z_{in}$, $$\frac{1}{Z_{in}} = \frac{1}{h_{FEN} \cdot (R_{gN1} + R_{gN2})} + \frac{1}{h_{FEP}(R_{gP1} + R_{gP2})}$$

If $R_{gN1} = R_{gN2} = R_{gN}$
and $R_{gP1} = R_{gP2} = R_{gP}$ $$\frac{1}{Z_{in}} = \frac{1}{2h_{FEN}R_{gN}} + \frac{1}{2h_{FEN}R_{gP}} = \frac{h_{FEN}R_{gN} + h_{FEP}R_{gP}}{2h_{FEN}h_{FEP}R_{gN}R_{gP}}$$

Figure 1:
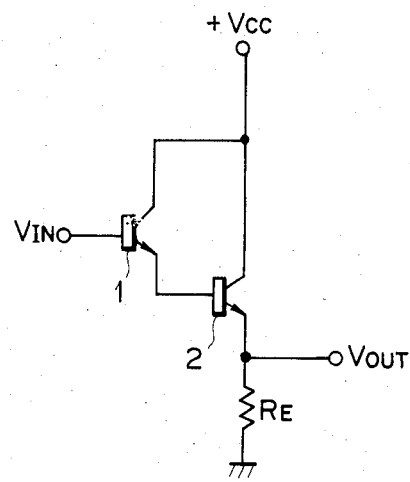
Figure 2:
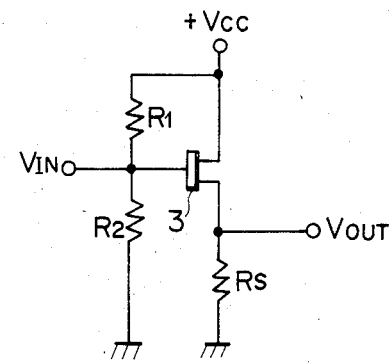
Figure 3:
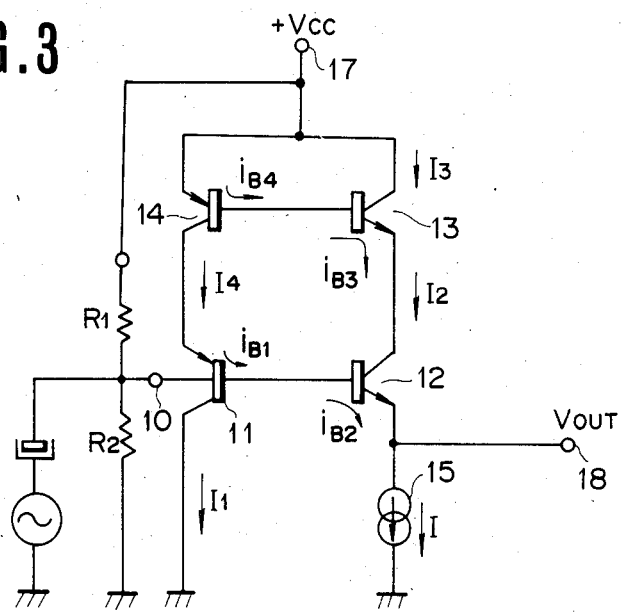

Hence $Z_{in} = \dfrac{2h_{FEN}h_{FEP}R_{gN}R_{gP}}{h_{FEN}R_{gN} + h_{FEP}R_{gP}}$ This means that with this circuit $h_{fe}$ times the input impedance of the arrangement where the resistors $R_{gN}$ and $R_{gP}$ are used for biasing in the manner as shown in FIG. 3 can be obtained. This circuit is capable of sinusoidal operation and amplification in a range of $$f_1 \geq \frac{1}{2\pi C_1 Z_{in}}$$

where $C_1$ is the capacitance of the capacitor C and $f_1$ is the frequency.

What is claimed is:

1. A high input impedance circuit comprising:
   a first differential circuit having a pair of NPN transistors and first and second input terminals;
   a second differential circuit having a pair of PNP transistors and first and second input terminals,
   said first input terminals of said first and second differential circuits being directly connected to each other and said second input terminals said first and second differential circuits being directly connected to each other;
   a first current source circuit connected to said first differential circuit for driving said first differential circuit;
   a second current source circuit connected to said second differential circuit for driving said second differential circuit;
   a signal input terminal connected directly to said first input terminals of said first and second differential circuits for supplying an input signal having no DC component to said first and second differential circuits; and
   nonresistive DC biasing means connected directly to said second input terminals of said first and second differential circuits for biasing said first and second differential circuits, whereby said nonresistive biasing means effects said high input impedance.

2. A high input impedance circuit according to claim 1, wherein said first current source circuit supplies a current equal to a current supplied by said second current source circuit.

3. A high input impedance circuit according to claim 1, wherein said first and second current source circuits comprise at least one transistor and at least one resistor.

4. A high input impedance circuit according to claim 3, wherein said first and second current source circuits comprise a current mirror circuit.

5. A high input impedance circuit according to claim 1, in which said signal is periodic, and further comprising a capacitor coupled in series electrically before said signal input terminal, said capacitor supplying said signal for a portion of each period of the latter.

* * * * *